(12) United States Patent
Lee et al.

(10) Patent No.: US 6,171,950 B1
(45) Date of Patent: Jan. 9, 2001

(54) METHOD FOR FORMING A MULTILEVEL INTERCONNECTION WITH LOW CONTACT RESISTANCE IN A SEMICONDUCTOR DEVICE

(75) Inventors: Yong-jae Lee; Soo-cheol Lee, both of Seoul (KR)

(73) Assignee: Samsung Electronics Co., Ltd., Kyungki-do (KR)

( * ) Notice: Under 35 U.S.C. 154(b), the term of this patent shall be extended for 0 days.

(21) Appl. No.: 09/330,129

(22) Filed: Jun. 11, 1999

Related U.S. Application Data

(62) Division of application No. 08/577,394, filed on Dec. 22, 1995, now Pat. No. 6,020,641.

(30) Foreign Application Priority Data

Dec. 23, 1994 (KR) .................................................. 94-36420

(51) Int. Cl.[7] ................................................ H01L 21/4763
(52) U.S. Cl. ........................ 438/637; 438/649; 438/657; 438/669
(58) Field of Search ..................................... 438/592, 595, 438/637, 640, 647, 630, 649, 651, 655, 657, 664, 669, 672, 677, 682, 683, 906; 257/383, 384, 412, 413, 754, 755, 756, 763, 764

(56) References Cited

U.S. PATENT DOCUMENTS

| | | | |
|---|---|---|---|
| 4,479,850 | 10/1984 | Beinvogl et al. | 156/643 |
| 4,707,723 | 11/1987 | Okamoto et al. | 357/67 |
| 5,160,407 | 11/1992 | Latchford et al. | 156/656 |
| 5,187,552 | 2/1993 | Hendrickson et al. | 257/408 |
| 5,194,404 * | 3/1993 | Nagatomo | 438/655 |
| 5,250,846 | 10/1993 | Kondo . | |
| 5,323,049 | 6/1994 | Motonami | 257/755 |
| 5,442,238 | 8/1995 | Takata | 257/758 |
| 5,587,604 | 12/1996 | Machesney et al. | 257/350 |
| 5,616,934 | 4/1997 | Dennison et al. | 257/67 |

FOREIGN PATENT DOCUMENTS

| | | |
|---|---|---|
| 4210821 A1 | 10/1992 | (DE) . |
| 0220517 A3 | 5/1987 | (EP) . |
| 0326204 A3 | 8/1989 | (EP) . |
| 5-335306 | 12/1993 | (JP) . |

* cited by examiner

*Primary Examiner*—T. N. Quach
(74) *Attorney, Agent, or Firm*—Pillsbury Madison & Sutro LLP

(57) ABSTRACT

A method for forming a multilevel interconnection between a polycide layer and a polysilicon layer is disclosed. The multilevel interconnection comprises: forming a first impurity-containing conductive layer on a semiconductor substrate; forming a first silicide layer, having a first region thinner than a second region, on the first impurity-containing conductive layer; forming an interlayer dielectric layer in other than the first region; forming a contact hole for exposing the first silicide layer of the first region; and connecting a second impurity-containing conductive layer to the first silicide layer through the contact hole.

6 Claims, 7 Drawing Sheets

METHOD FOR FORMING A MULTILEVEL INTERCONNECTION WITH LOW CONTACT RESISTANCE IN A SEMICONDUCTOR DEVICE

This is a division of application Ser. No.08/577,394, filed Dec. 22, 1995, U.S. Pat. No. 6,020,641.

BACKGROUND OF THE INVENTION

The present invention relates to the structure and method for forming a semiconductor device. More particularly, the present invention relates to a multilevel interconnection of a semiconductor device having a lower conductive layer whose uppermost surface is formed of silicide, connected through a contact hole to an impurity-containing upper conductive layer, and the method of the semiconductor device.

A multilayer interconnecting method for forming the conductive layers of an integrated semiconductor device into a multilayer structure can increase integration while maintaining electrical reliability of the device. In such a structure, a contact resistance between conductive layers is the most important factor in determining the electrical reliability. Here, even though conductive material having a low resistance may be used to form the interconnection, the resulting contact resistance may be high, so that the overall resistance of the whole interconnection is increased, which seriously deteriorates the electrical characteristics of the device. The contact resistance largely depends on the dimensions of the contact hole. Currently, since contact holes tend to become smaller as integration increases, a change in the contact resistance depending from a reduction of the contact hole's dimension is an increasingly important issue for semiconductor manufacturing.

Aluminum has been conventionally used as the material constituting the interconnection. Aluminum has the advantage of low sheet resistance, while it has the disadvantage of a low melting point. This causes a serious problem in that the interconnection is deformed by the heat energy provided when the device is manufactured. Accordingly, conductive material such as polysilicon is mainly used as the material constituting the interconnection. The magnitude of the polysilicon sheet resistance can be controlled by the concentration of doped impurities and polysilicon has a high melting point which prevents the interconnection from deforming even at high thermal energy.

For instance, monolayer-structured polysilicon into which a N-type or P-type impurity is doped, or multilayered polycide in which silicide such as tungsten silicide ($WSi_x$) is laminated on the monolayer-structured polysilicon is mainly used.

FIG. 1 is a cross-sectional view showing a general multilevel interconnection between a polycide layer and a polysilicon layer. Here, reference numeral 10 denotes a semiconductor substrate, 12 denotes a first polysilicon layer, 14 denotes a first silicide layer, 16 denotes an interlayer dielectric layer, 18 denotes a second polysilicon layer, and 1 denotes a contact hole.

As shown in FIG. 1, in the formation of the multilevel interconnection, a lower conductive layer of a polycide structure in which first polysilicon layer 12 and first silicide layer 14 are laminated onto semiconductor substrate 10 is connected to an upper conductive layer such as a mono-layered second polysilicon 18 through contact hole 1 formed in interlayer dielectric layer 16.

Pure polysilicon cannot be used as conductive material due to its high sheet resistance. If predetermined impurity ions are doped into the pure polysilicon, however the sheet resistance is reduced and the doped polysilicon can be used as a conductive material. Generally, the doping of impurities into pure polysilicon is carried out during or after the deposition of polysilicon.

Also, since silicide has a much lower resistance than impurity-doped polysilicon, a conductive layer having the structure of a silicide layer laminated on a polysilicon layer (i.e., polycide structure) is mainly used.

Generally, in a multilevel interconnection having a polycide structure, the resistance of the interconnection can be reduced by laminating a silicide layer with low resistance onto a polysilicon layer. The impurity ions doped into the polysilicon, however, diffuse through the interface between the polysilicon layer and the silicide layer thereby increasing the contact resistance. Therefore, the electrical characteristics and integration degree of the device are deteriorated.

FIG. 2A is a cross-sectional view of a multilevel interconnection having a lower conductive layer constituted a polysilicon, and FIG. 2B is a cross-sectional view of a multilevel interconnection having a polycide-structured lower conductive layer.

In FIG. 2A, the lower conductive layer is made of only a first layer of polysilicon, and the upper conductive layer has a polycide structure in which a second layer of polysilicon and tungsten silicide are sequentially laminated on the first layer of polysilicon. Here, silicide is not interposed between the first and second layers of polysilicon.

In FIG. 2B, the lower conductive layer has a polycide structure in which a first layer of polysilicon and first tungsten silicide are sequentially, and the upper conductive layer has a polycide structure in which a second layer of polysilicon and a second layer of tungsten silicide are sequentially laminated. Here, silicide is interposed between the first and second layers of polysilicon.

FIG. 3 is a graph showing the distribution of the multilevel interconnection resistances according to the structure of the lower conductive layer, in which "A" represents a contact resistance between polysilicon layers when phosphorus ions are doped into the polysilicon, "B" represents a contact resistance between a polycide-structured lower conductive layer and an upper conductive layer where boron ions are doped into the polysilicon constituting the upper conductive layer, and "C" represents a contact resistance between a polycide-structured lower conductive layer and an upper conductive layer where arsenic ions are doped into the polysilicon constituting the upper conductive layer.

As shown in FIG. 3, it can be seen that the contact resistance generated when a polysilicon layer is directly connected to another polysilicon layer is much smaller than that between a polycide layer and a polysilicon layer.

It is assumed that this is due to the increase in contact resistance of the contact region, resulting from absorption of impurities doped into the second polysilicon layer, to the interface of the second polysilicon layer and the first silicide layer.

Therefore, to improve the electrical characteristics and integration degree of the semiconductor device, the problem in which a contact resistance increases by diffusing impurity, doped into the polysilicon layer, to the interface between to polysilicon layer and to silicide layer should be solved.

SUMMARY OF THE INVENTION

An object of the present invention is to provide a multilevel interconnection for reducing contact resistance between a lower conductive layer, whose uppermost surface is formed of silicide, and an upper conductive layer, whose lowermost surface is formed of an impurity-containing conductive layer, thereby forming a multilayer interconnection with high reliability.

Another object of the present invention is to provide a suitable method for forming the above structural multilevel interconnection.

To achieve the first object, there is provided a multilevel interconnection comprising: a first impurity-containing conductive layer formed on a semiconductor substrate; a first silicide layer, having a first region thinner than a second region, formed on said first impurity-containing conductive layer; an interlayer dielectric layer formed on a region other than said first region; a contact hole for exposing said first silicide layer of said first region; and a second impurity-containing conductive layer connected to said first silicide layer through said contact hole.

To achieve the first object, there is provided a multilevel interconnection comprising: a first impurity-containing conductive layer formed on a semiconductor substrate; a first silicide layer formed on said first impurity-containing conductive layer and having a hole; an interlayer dielectric layer formed with a contact hole for exposing said first impurity-containing conductive layer exposed by said hole; and a second impurity-containing conductive layer connected to said first impurity-containing conductive layer through said contact hole.

In the multilevel interconnection according to the present invention, it is preferable that the first and second impurity-containing conductive layers are made of polysilicon.

It is preferable that a second silicide layer is formed on the second impurity-containing conductive layer.

It is preferable that the first silicide layer is made of one selected from the silicide group consisting of tungsten silicide ($WSi_2$), titanium silicide ($TiSi_2$), tantalum silicide ($TaSi_2$) and molybdenum silicide ($MoSi_2$).

To achieve the second object, there is provided a method of forming a multilevel interconnection, comprising the steps of: (a) forming a first impurity-containing conductive layer on a semiconductor substrate; (b) forming a first silicide layer on said first impurity-containing conductive layer; (c) forming an interlayer dielectric layer on the resultant substrate; (d) partially etching said interlayer dielectric layer to form a contact hole for exposing said first silicide layer; (e) etching said first silicide layer exposed through said contact hole; and (f) forming a second impurity-containing conductive layer on the resultant substrate.

In the method of forming a multilevel interconnection, according to the present invention, it is preferable that the first and second impurity-containing conductive layers are formed of polysilicon.

It is preferable that the first silicide layer is formed of one selected from the silicide group consisting of tungsten silicide ($WSi_2$), titanium silicide ($TiSi_2$), tantalum silicide ($TaSi_2$) and molybdenum silicide ($MoSi_2$).

It is preferable that, in step (e), the first silicide layer exposed through the contact hole is etched until the first impurity-containing conductive layer is exposed.

It is preferable that, in step (e), the first silicide layer exposed through the contact hole is etched so that the first impurity-containing conductive layer is not exposed. Here, it is more preferable that the first silicide layer is etched until its thickness is reduced to two thirds or less of the thickness before etching.

It is preferable that the forming method further comprises, after step (f), the step of forming a second silicide layer on the second impurity-containing conductive layer.

According to the multilevel interconnection and the method of forming thereof according to the present invention, the problem involving contact resistance being generated by the diffusion of impurity, doped in the polysilicon layer, to the interface between the polysilicon layer and the silicide layer can be solved.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

First Embodiment

Figure 1:
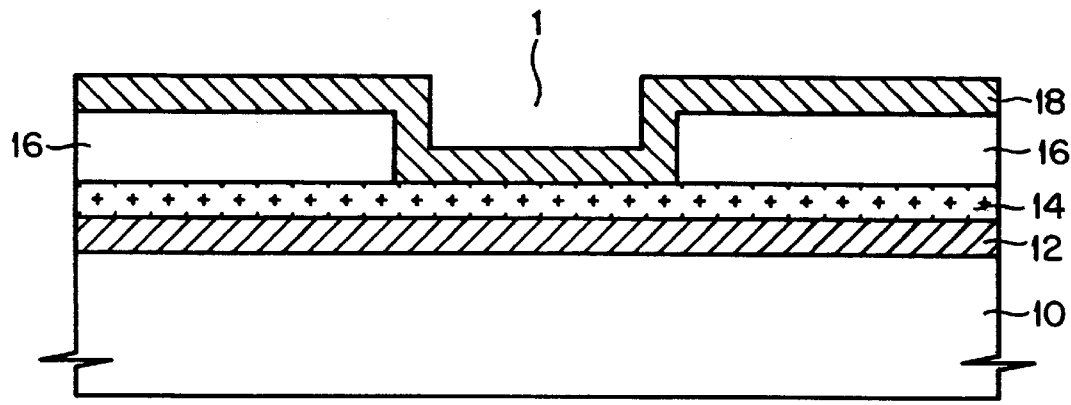
FIG. 1 is a cross-sectional view showing a general multilevel interconnection between a polycide layer and a polysilicon layer.
Figure 2A:
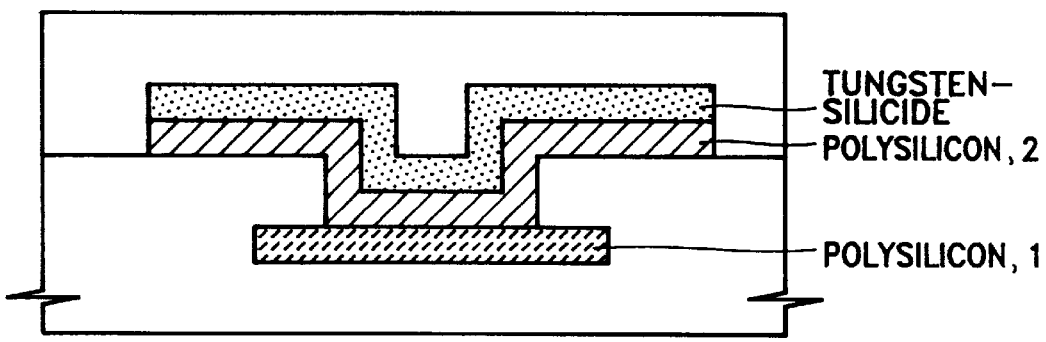
FIG. 2A is a cross-sectional view of a multilevel interconnection having a lower conductive layer constituted of polysilicon.
Figure 2B:
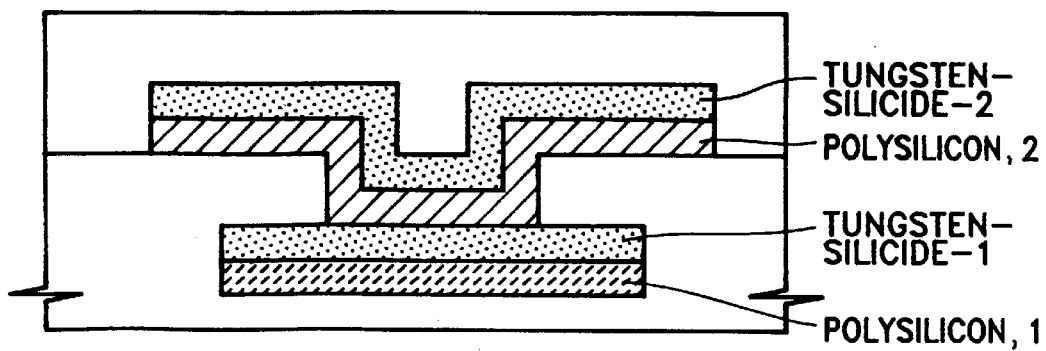
FIG. 2B is a cross-sectional view of a multilevel interconnection having a polycide-structured lower conductive layer.
Figure 3:
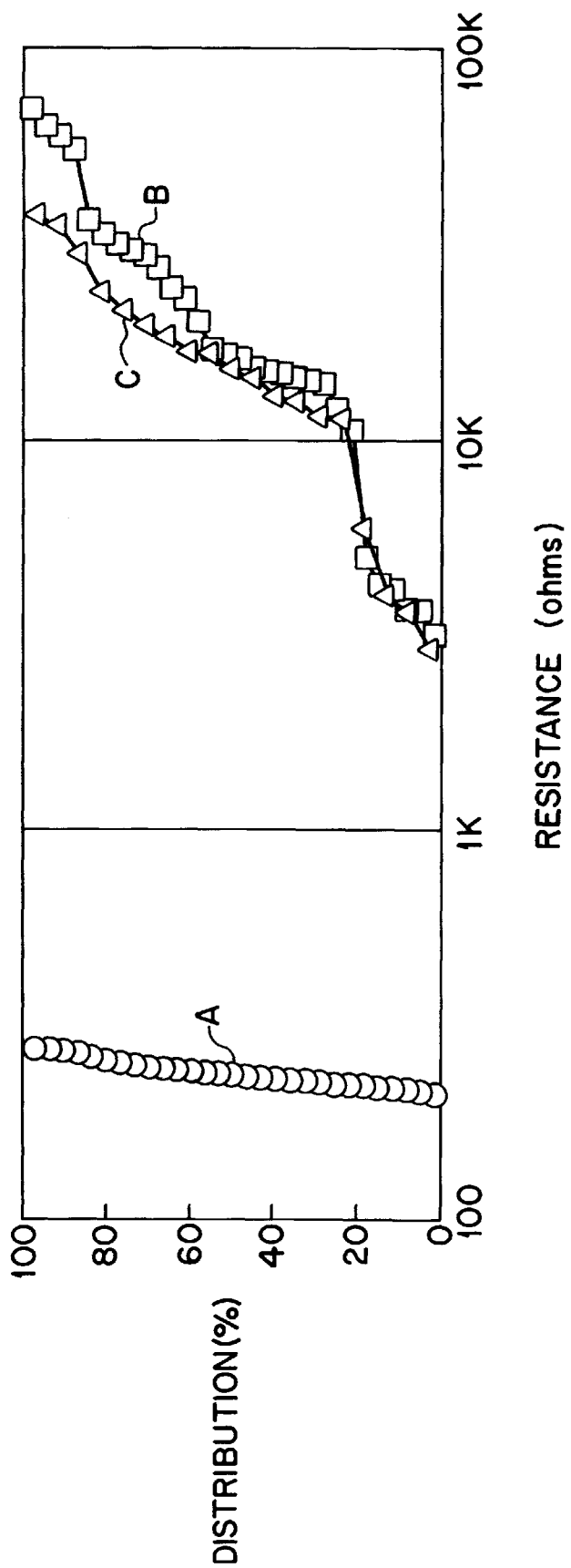
FIG. 3 is a graph showing the distribution of the multilevel interconnection resistances according to the structure of the lower conductive layer.
Figure 4:
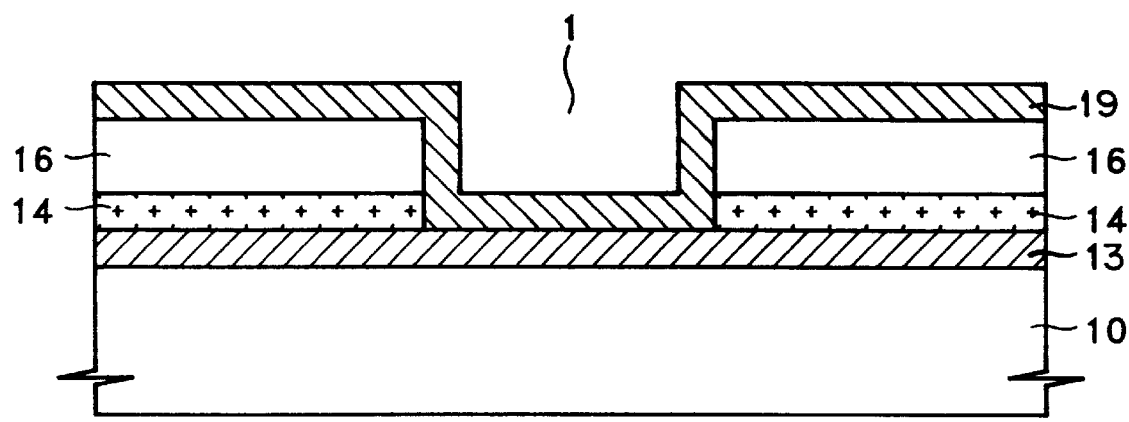
FIG. 4 is a cross-sectional view showing a multilevel interconnection according to a first embodiment of the present invention.

FIG. 4 is a cross-sectional view of a multilevel interconnection according to a first embodiment of the present invention. The multilevel interconnection, shown in FIG. 4, connects a lower conductive layer, having a polycide structure in which first impurity-containing conductive layer 13 and first silicide layer 14 are sequentially laminated, to an upper conductive layer, constituted only by second impurity-containing conductive layer 19, through contact hole 1.

First impurity-containing conductive layer 13, constituting the lower conductive layer, and second impurity-containing conductive layer 19, constituting the upper conductive layer, are directly connected through contact hole 1. That is, first silicide layer 14 is not interposed between first and second impurity-containing layers 13 and 19.

In this embodiment, first and second impurity-containing conductive layers 13 and 19 are formed of impurity-doped polysilicon. Also, a second silicide layer (not shown) is further formed on second impurity-containing conductive layer 19.

First silicide layer 14 is formed on first impurity-containing conductive layer 13, excluding the region where contact hole 1 is to be formed. Second impurity-containing conductive layer 19 is connected to first impurity-containing conductive layer 13 exposed by contact hole 1.

As the upper and lower conductive layers are tied together without interposing silicide, by directly connecting the impurity-containing conductive layers to each other, the impurity doped into the impurity-containing conductive layers does not diffuse into the silicide layer. Therefore, an increase in contact resistance which results from the diffusion of impurities does not occur.

With reference to FIGS. 5A–5D, the process of forming a multilevel interconnection, according to this embodiment can now be explained.

Figure 5A:
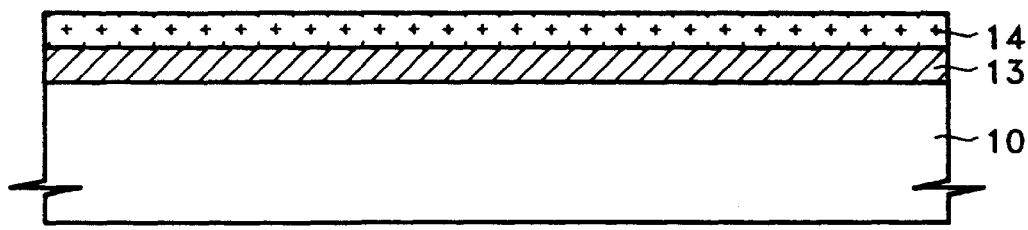
FIGS. 5A–5D are cross-sectional views for sequentially illustrating the forming process according to the first embodiment of forming of a multilevel interconnection structure of the present invention.

FIG. 5A shows the process of forming a lower conductive layer consisting of first impurity-containing conductive layer 13 and first silicide 14. This process is sequentially performed by the steps of: forming first impurity-containing conductive layer 13 on semiconductor substrate 10 forming first silicide layer 14 on first impurity-containing conductive layer 13; and partially etching first silicide layer 14 and first impurity-containing conductive layer 13 to form a lower conductive layer 13 and 14.

First impurity-containing conductive layer 13 formed by doping N-type impurity ions such as phosphorus (P) into polysilicon. First silicide layer 14 is formed by using the silicide, for example, tungsten silicide ($WSi_2$).

Instead of phosphorus (P), N-type impurity ions such as arsenic (As) or P-type impurity ions such as boron (B) can be doped into the polysilicon. Furthermore, first silicide layer 14 can be formed by using one selected from the silicide group consisting of titanium silicide ($TiSi_2$), tantalum silicide ($TaSi_2$), and molybdenum silicide ($MoSi_2$), instead of tungsten silicide ($WSi_2$).

Figure 5B:
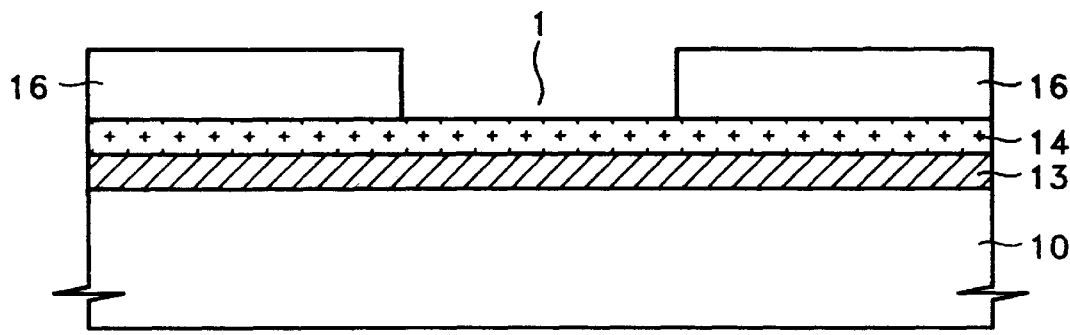

FIG. 5B shows the process of forming contact hole 1. This process is sequentially performed by the steps of: forming interlayer dielectric layer 16 on the resultant substrate where the lower conductive layer is formed; and partially etching the interlayer dielectric layer at the region where a contact hole is to be formed, to form contact hole 1 for partially exposing first silicide layer 14. Here, interlayer dielectric layer 16 is formed by using insulation material such as silicon dioxide ($SiO_2$).

Figure 5C:
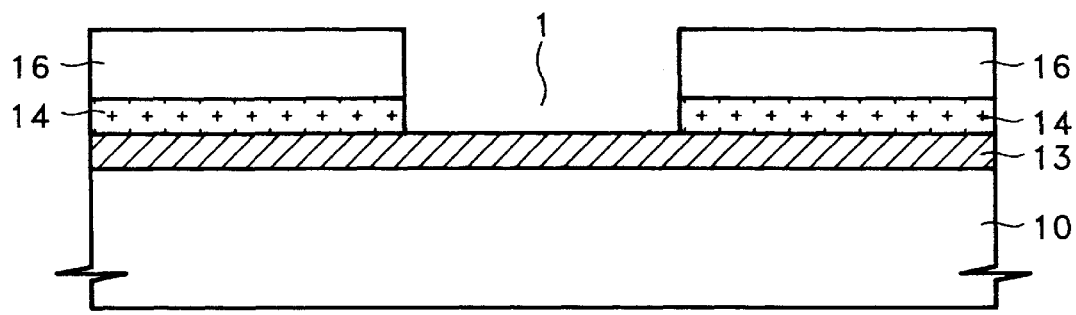

FIG. 5C shows the process of etching first silicide layer 14. This process is performed by the step of removing the exposed first silicide layer to partially expose first impurity-containing conductive layer 13.

Figure 5D:
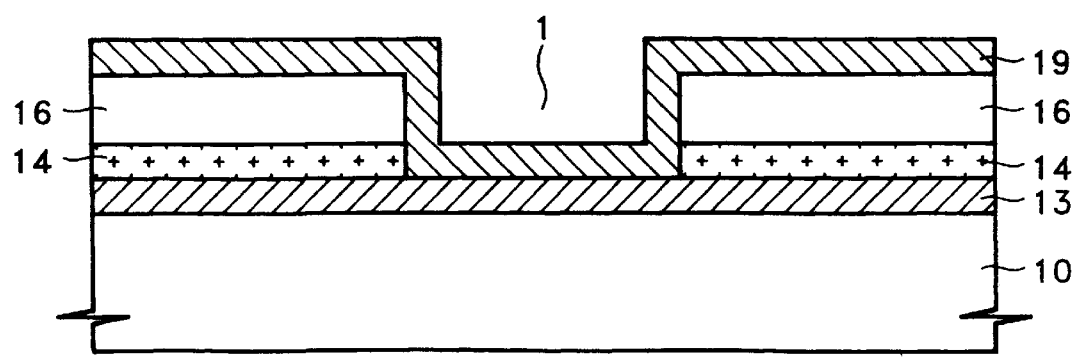

FIG. 5D shows the process of forming second impurity-containing conductive layer 19. This process is performed by the step of forming second impurity-containing conductive layer 19 on the resultant substrate where first impurity-containing conductive layer 13 is partially exposed. Here, second impurity-containing conductive layer 19 is formed by doping impurities into polysilicon. The doped impurities into second impurity-containing conductive layer 19 has the same conductive type (i.e., N-type or P-type) as those of first impurity-containing conductive layer 13.

Second impurity-containing conductive layer 19 is connected to first impurity-containing conductive layer 13 exposed through contact hole 1.

Also, after the step of forming second impurity-containing conductive layer 19, a second silicide layer (not shown) is further formed on the second impurity-containing conductive layer by depositing silicide, for example, tungsten silicide ($WSi_2$). Here, the second silicide layer can be formed by depositing one selected from the silicide group consisting of titanium silicide ($TiSi_2$), tantalum silicide ($TaSi_2$) and molybdenum silicide ($MoSi_2$), instead of tungsten silicide ($WSi_2$).

Second Embodiment

Figure 6:
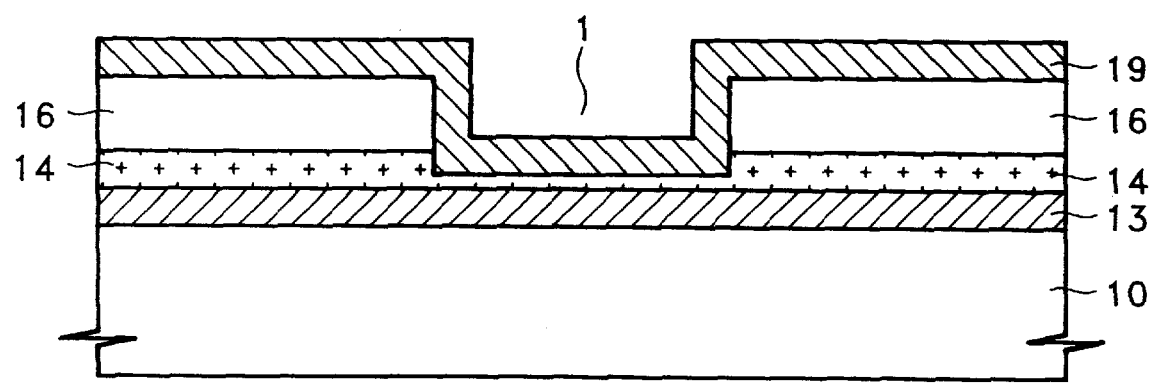
FIG. 6 is a cross-sectional view of a multilevel interconnection according to a second embodiment of the present invention.

FIG. 6 shows a multilevel interconnection, according to a second embodiment, which connects first impurity-containing conductive layer 13 constituting a lower conductive layer, to second impurity-containing conductive layer 19, constituting an upper conductive layer, by interposing first silicide layer 14.

Here, the first silicide layer formed at the region where a contact hole is to be formed is thinner than the first silicide layer formed at the other regions. Preferably, the thickness of the first silicide layer formed at the region where a contact hole is to be formed is two thirds as thick as the first silicide layer formed at the other regions.

FIGS. 7A–7D, show the process of forming a multilevel interconnection, according to the second embodiment, as will now be explained.

Figure 7A:
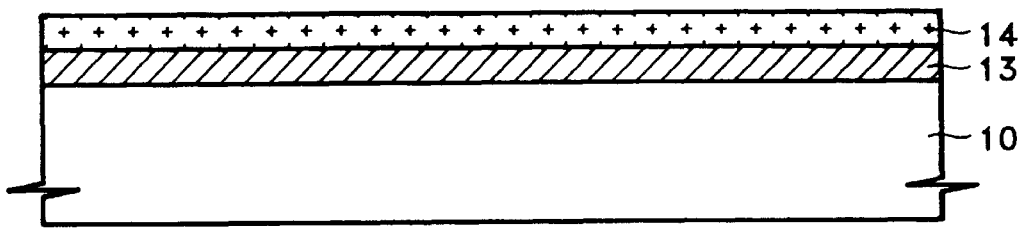
FIGS. 7A–7D are cross-sectional views for sequentially illustrating the forming process according to the second embodiment of forming a multilevel interconnection structure of the present invention.
Figure 7B:
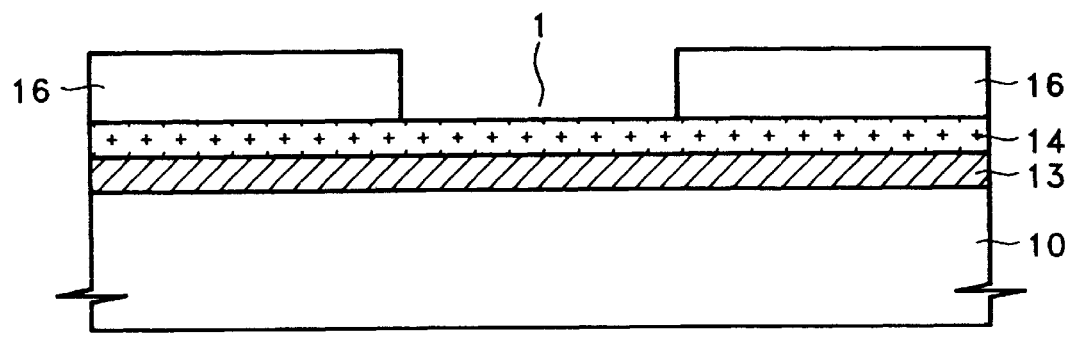

First impurity-containing conductive layer 13 is formed on semiconductor substrate 10 by depositing impurity-doped polysilicon, and first silicide layer 14 is then laminated thereon, for example, to a thickness of 500–3,000 Å (FIG. 7A).

Figure 7C:
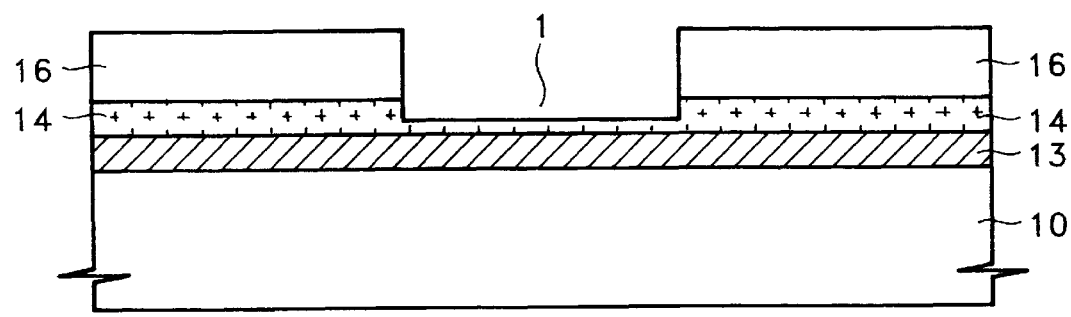

After interlayer dielectric layer 16 is formed on silicide layer 14 and then partially etched (FIG. 7B), the first silicide layer exposed through contact hole 1 is partially etched such that the thickness of the layer is reduced to two thirds or less of the original thickness of the layer (i.e., about 200 Å), and thus the first silicide layer formed at the region where a contact hole is to be formed is formed to be thinner than the first silicide layer formed at the other regions (FIG. 7C).

Figure 7D:
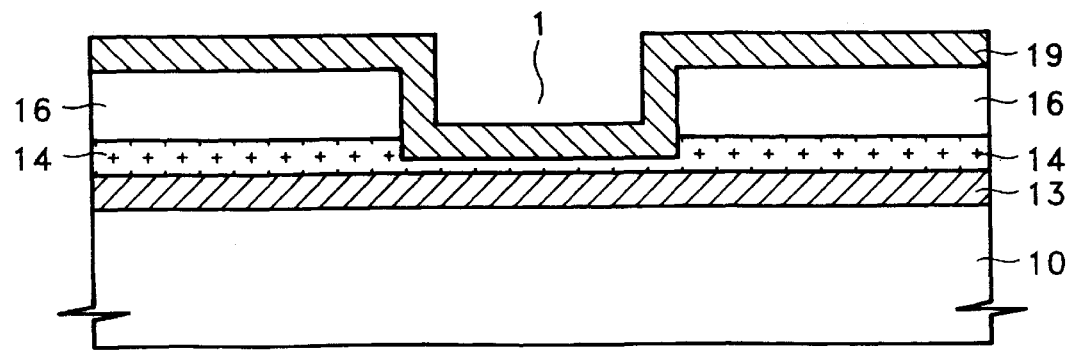

Then, second impurity-containing conductive layer 19 is formed according to the same process as explained in the first embodiment (FIG. 7D).

Figure 8:
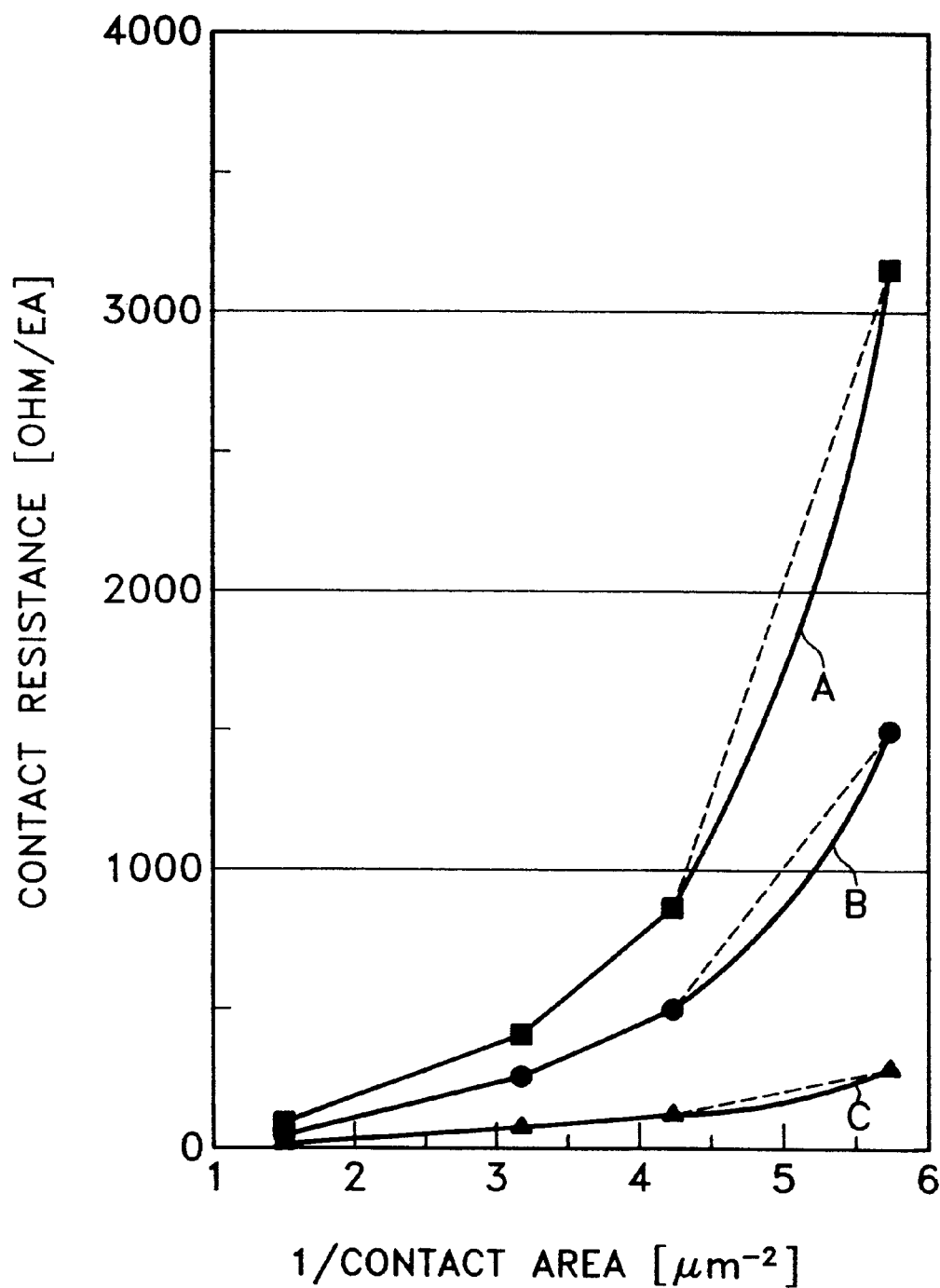
FIG. 8 is a graph showing contact resistance values depending on the thickness of the silicide layer of the lower conductive layer.

As shown in FIG. 8, contact resistant values depending on the thickness of the silicide layer of the lower conductive layer are plotted on the graph.

The lower conductive layer includes tungsten silicide of 1,200 Å thickness laminated on polysilicon of 900 Å thickness, and the upper conductive layer is formed of polysilicon 900 Å in thickness.

In FIG. 8, "A" represents a contact resistance to 1/contact area when the silicide layer is not etched at all, "B" represents a contact resistance to 1/contact area when the silicide layer is etched by about 700 Å, and "C" represents a contact resistance to 1/contact area when the silicide layer is etched by about 1,000 Å.

According to the graph of FIG. 8, the thinner the silicide layer formed on the region where a contact hole is to be formed, the lower is the contact resistance between the upper conductive layer and lower conductive layer.

In the multilevel interconnection and method of forming whose the present invention, for a contact structure connecting a lower conductive layer whose uppermost surface is made of a silicide layer, to an upper conductive layer whose lowermost surface is made of an impurity-containing conductive layer, has a silicide layer, constituting the lower conductive layer formed to be as thin as possible (or completely removed) to thereby prevent an increase in contact resistance, by the diffusion of impurity ions doped into the polysilicon layer into the interface between the polysilicon layer and the silicide layer.

The present invention is not limited to the above examples, and many other variations will be readily apparent to those ordinarily skilled in this art.

What is claimed is:

1. A method for forming a multilevel interconnection comprising the steps of:
    forming a first doped polysilicon layer on a semiconductor substrate;
    forming a first silicide layer on said first doped polysilicon layer;
    forming an interlayer dielectric layer on said first silicide layer;
    forming a contact hole in said interlayer dielectric layer;
    forming a first region and a second region in said first silicide layer, said first region having a thickness which is greater than 0 Å and equal to or less than two thirds of the thickness of said second region; and
    forming an impurity-containing conductive layer within the contact hole and on the first region so that said impurity-containing conductive layer is connected to said first silicide layer.

2. The method of claim 1, wherein said first silicide layer is formed of one selected from a silicide group consisting of tungsten silicide, titanium silicide, tantalum silicide, and molybdenum silicide.

3. The method of claim 1, wherein the impurity-containing conductive layer is a second doped polysilicon layer, and
    wherein the step of forming a second doped polysilicon layer is followed by the step of forming a second silicide layer on said second doped polysilicon layer.

4. A method for forming a multilevel interconnection comprising the steps of:
    forming a first doped polysilicon layer on a semiconductor substrate;
    forming a first silicide layer with a first thickness on said first doped polysilicon layer;
    forming an interlayer dielectric layer on said first silicide layer;
    etching said interlayer dielectric layer to form a contact hole for exposing said first silicide layer;
    partially etching said exposed first silicide layer to produce a region thereon having a second thickness, said second thickness being greater than 0 Å and equal to or less than two-thirds of said first thickness; and
    forming an impurity-containing conductive layer within the contact hole and on the region having a second thickness so that said impurity-containing conductive layer is connected to said first silicide layer through said region.

5. The method of claim 4, wherein said first silicide layer is formed of one selected from a silicide group consisting of tungsten silicide, titanium silicide, tantalum silicide and molybdenum silicide.

6. The method of claim 4, wherein said impurity-containing conductive layer is a second doped polysilicon layer, and
    wherein the step of forming a second doped polysilicon layer is followed by the step of forming a second silicide layer on said second doped polysilicon layer.

* * * * *